United States Patent [19]

Volz et al.

[11] Patent Number: 5,273,441
[45] Date of Patent: Dec. 28, 1993

[54] SMA BURN-IN SOCKET

[75] Inventors: Keith L. Volz, Jamestown; Robert M. Renn, Pfafftown; Frederick R. Deak, Kernersville; Warren A. Bates; David C. Johnson, both of Winston Salem; Robert D. Irlbeck, Greensboro, all of N.C.

[73] Assignee: The Whitaker Corporation, Wilmington, Del.

[21] Appl. No.: 975,350

[22] Filed: Nov. 12, 1992

[51] Int. Cl.⁵ .............................. H01R 9/09
[52] U.S. Cl. .................................. 439/72; 439/161
[58] Field of Search .............. 439/65, 68, 70, 71, 439/72, 73, 161, 330, 331

[56] References Cited

U.S. PATENT DOCUMENTS

| 4,505,532 | 3/1985 | Hine et al. ............ 439/161 X |
| 4,786,256 | 11/1988 | Angeleri et al. ............ 439/72 |
| 5,001,302 | 3/1991 | Atsumi ............ 439/66 X |
| 5,098,309 | 3/1992 | Deak et al. ............ 439/161 X |

Primary Examiner—Daniel W. Howell
Assistant Examiner—Khiem Nguyen
Attorney, Agent, or Firm—William B. Noll

[57] ABSTRACT

A burn-in socket for integrated circuit chips has a clamping means actuated by a thermally-reactive resilient means, operative during the burn-in cycle itself, such that the chip frames are retained and good electrical contact with the chip leads is maintained during burn-in.

8 Claims, 4 Drawing Sheets

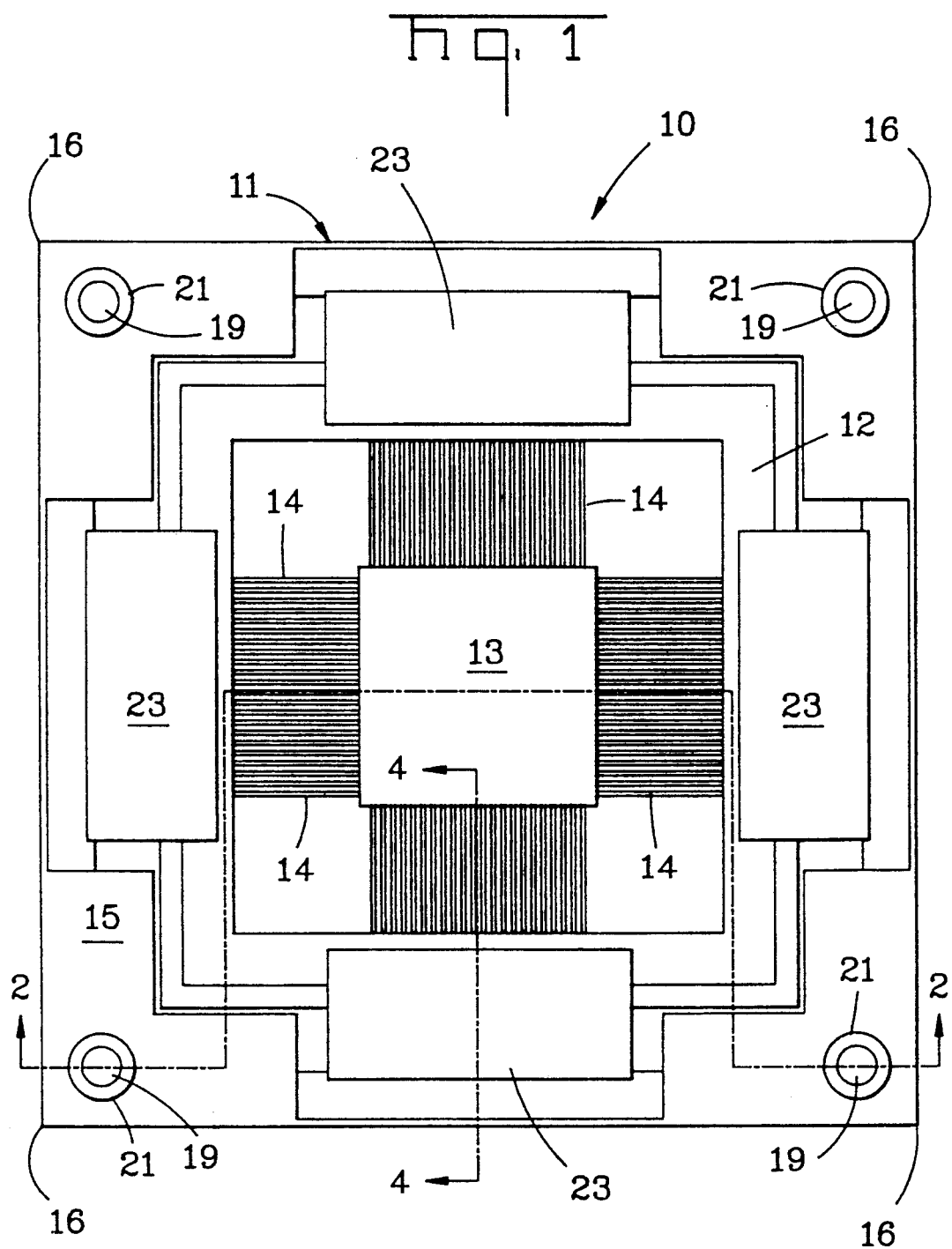

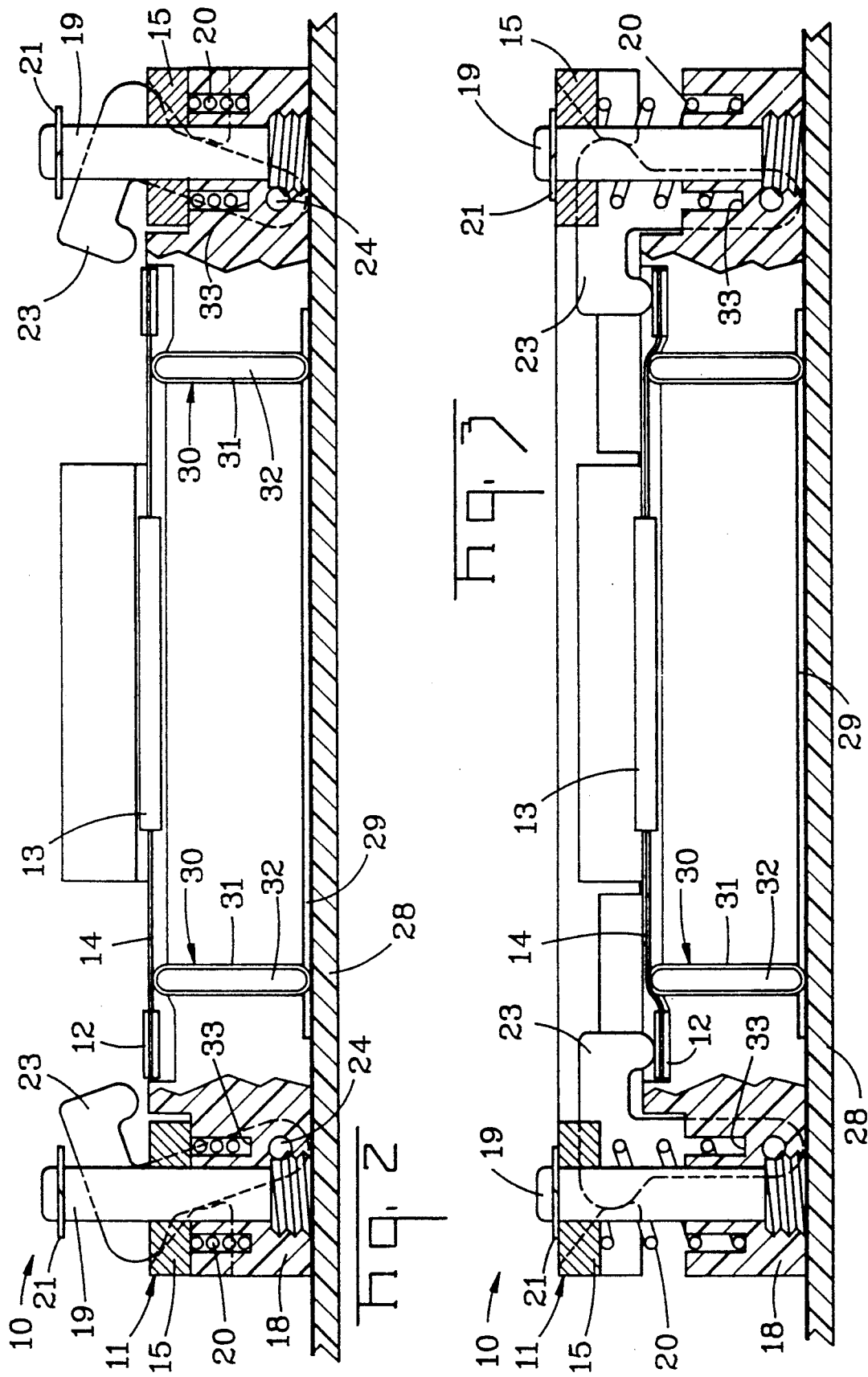

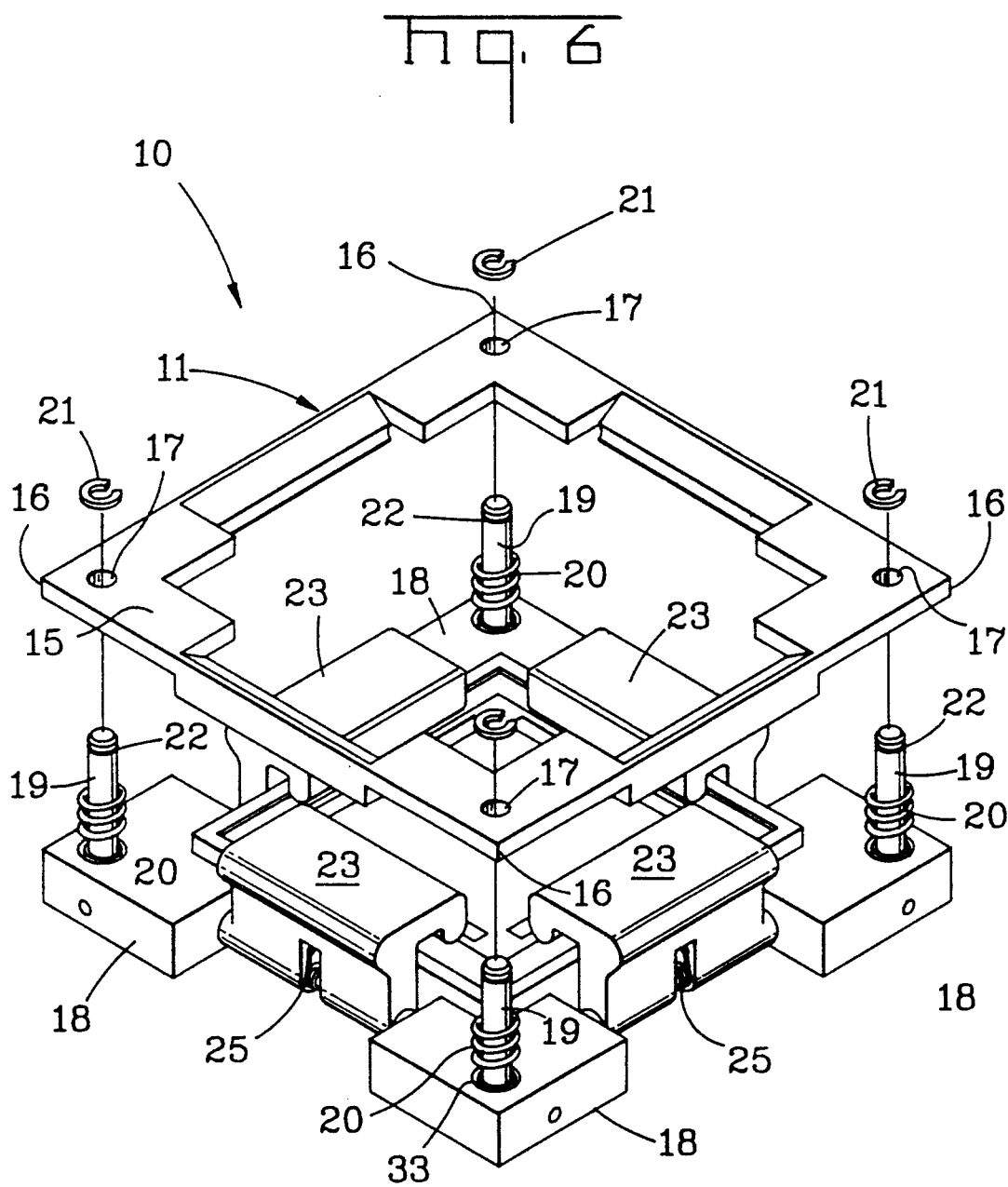

SMA BURN-IN SOCKET

FIELD OF THE INVENTION

The present invention relates to burn-in sockets for integrated circuit "chips", and more particularly, to burn-in sockets for testing chips and weeding out early failures.

BACKGROUND OF THE INVENTION

Experience has shown that the catastrophic failure of an integrated circuit chip, such as a microprocessor, will occur (if at all) during the initial phase of the chip life. If the chip passes its "infant mortality" phase, the life and reliability of the chip will have a relatively high probability.

To precipitate early chip failure, the chip is "exercised" or powered while being subjected to relatively high external temperatures. Typically, a batch of chips is electrically powered in an oven where the temperature is maintained at approximately 150° C. for an extended period of time, such as 1,000 hours. This is referred to in the art as "burn-in".

During burn-in, a batch of chips may be mounted on a mother board, and the chip leads are electrically connected to respective circuit elements on the mother board by a suitable means, such as one or more flexible electrical connectors. Maintaining good electrical contact between the chip leads and the flexible electrical connector is very important. Where the leads are made of gold, the electrical contact is usually not a major problem; but where the chip leads are tin plated, a relatively high retention force is necessary to assure good electrical contact. This is due to oxidation of the tin-plated chip leads. Oxidation will occur in the interval between the tin-plating bath or process and the burn-in stage, an interval of perhaps a few weeks. Even if the oven has a nitrogen atmosphere, it is still necessary to maintain a relatively-high clamping force to retain the chip frames and assure good electrical contact with the chip leads.

In order to maintain the necessary retention force, especially where the chip leads are tin-plated, a system of levers or oversized latches are necessary in order to achieve the necessary mechanical advantage for the desired retention force. However, because of space problems, this is not feasible nor particularly desirable since it reduces the total number of chips on the board and thus reduces production rates.

For large batches of chips, the testing apparatus is fully automated and includes robotic arms for transferring the batches of chips into and out of the oven. In production, and because of the relatively large number of chips being burned-in, the prior clamping mechanisms interfere with the high-speed automated apparatus for transferring large batches of chips.

SUMMARY OF THE INVENTION

Accordingly, it is an object of the present invention to provide a clamping means which is fully compatible with automated chip burn-in, yet sufficiently flexible to be used with semi-automatic or manual equipment.

It is another object of the present invention to avoid the use of oversized latches, levers or cumbersome clamping mechanisms, thereby optimizing the oven space and assuring high production rates for the burn-in test phase.

It is yet another object of the present invention to provide a clamping means which is actuated by a thermally-reactive resilient means.

In accordance with the teachings of the present invention, there is herein disclosed an improved burn-in test socket for an integrated circuit chip, wherein heat is applied to the chip and socket, and wherein the chip includes a chip frame and further includes a plurality of chip leads. The improvement includes a clamping means for retaining the chip frame. An electrical means engages the chip leads for applying an electrical current thereto during burn-in, and a thermally-reactive resilient means is provided for actuating the clamping means. This thermally-reactive resilient means provides a relatively low force at ambient temperatures and a relatively high force at high temperatures, such that the clamping means retains the chip frame, and such that good electrical contact is maintained between the electrical means and the chip leads during burn-in.

The clamping means includes a camming means and further includes a latching means to initially exert a relatively low force on the chip frame, thereby facilitating the initial loading into the oven. The camming means and the latching means have cooperating cam elements engaging each other. As a result, during burn-in the camming means exerts a relatively high force through the latching means to the chip frame.

The camming means preferably comprises a substantially rectangular camming ring; and the thermally-reactive resilient means is made from a shape memory alloy, such that the resilient means expands at elevated temperatures to lift the camming ring, thereby camming the latching means against the chip frame.

These and other objects of the present invention will become readily apparent from a reading of the following specification, taken in conjunction with the enclosed drawings.

BRIEF DESCRIPTION OF THE DRAWINGS

FIG. 1 is a top plan view of the burn-in socket of the present invention, showing the chip together with its leads and frame.

FIG. 2 is a stepped cross-sectional view thereof, taken along the lines 2—2 of FIG. 1, showing the latches and the camming ring in their initial unlatched position.

FIG. 3 corresponds substantially to FIG. 2, but shows the thermally-reactive coil springs expanded to raise the camming ring to exert its force on the latches, thereby retaining the chip frame, and thereby insuring good electrical contact between the chip leads and the flexible electrical connector during burn-in.

FIG. 6 is an exploded perspective view of the components of the burn-in socket of the present invention, the chip with its frame being omitted for ease of illustration.

GENERAL DESCRIPTION OF THE PREFERRED EMBODIMENT

Figure 4:
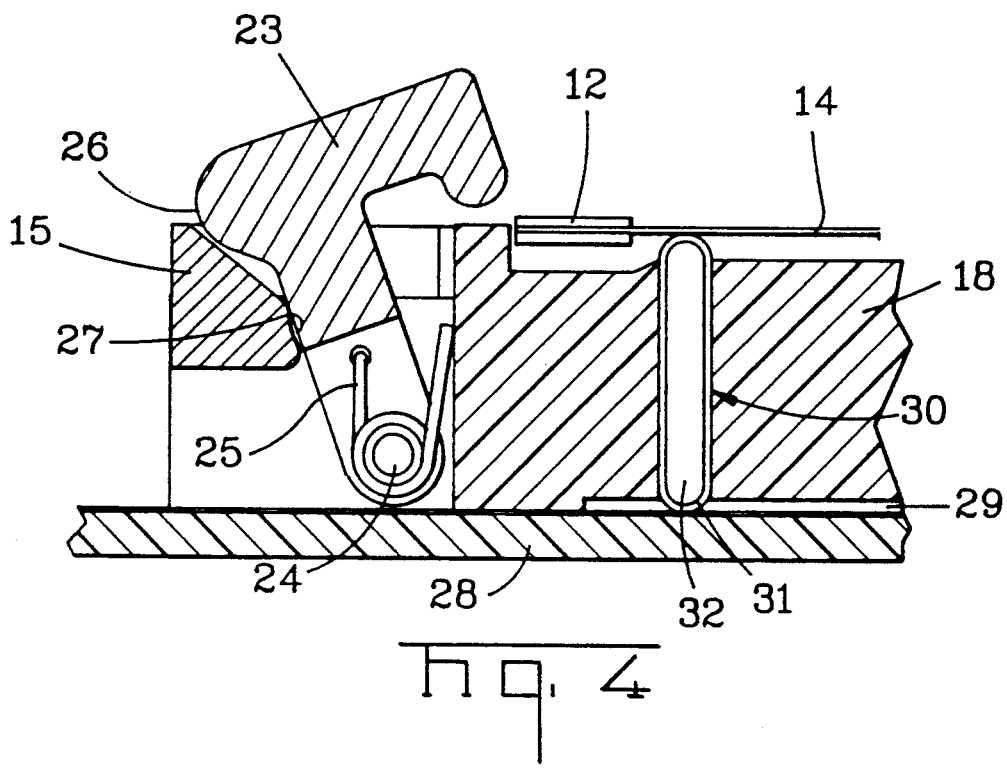
FIG. 4 is a further cross-sectional view, taken along the lines 4—4 of FIG. 1, and showing one of the latches in its unlatched position.

With reference to the drawings, the burn-in socket 10 of the present invention includes a clamping means 11 for retaining the chip frame 12 during burn-in while insuring good electrical contact. The chip frame 12 supports a chip 13 having a plurality of leads 14. The chip 13 comprises an integrated circuit, such as a microprocessor or microcomputer; however, it will be appreciated by those skilled in the art, that the teachings of the present invention are not necessarily confined thereto, but rather are equally applicable to a wide variety of semiconductor and related devices where testing and/or burn-in are necessary or desirable.

With this in mind, the clamping means 11 includes a camming ring 15 which, in the preferred embodiment as shown more clearly in FIG. 6, has a substantially rectangular configuration and includes four corners 16, each of which is provided with an opening 17. A housing 18, also preferably having a substantially rectangular configuration, has four guide posts 19, one for each of the corners 16; and the camming ring 15 is slidably guided on the respective guide posts 19 mounted on the housing 18.

A thermally-reactive resilient means, preferably comprising a coil spring 20, is carried by each of the guide posts 19. As shown more clearly in FIGS. 2 and 3, each spring 20 is piloted within a trepan 33 formed in the housing 18, and each spring 20 is disposed between the housing 18 and the camming ring 15. The camming ring 15 is retained on the guide posts 19 by means of respective snap rings 21, each of which is received in an external annual groove 22 in the respective guide post 19.

The springs 20, which may be supplied by Memory Metals Inc. (of Stamford, Connecticut) are referred to in the art as "SMA" springs, being made from a shape memory alloy. These SMA springs 20 have a shape memory effect (first discovered in 1932 in a copper-zinc alloy) and exhibit a thermoelastic martensite transformation. For a purpose hereinafter described, the springs 20 exert a relatively low force at ambient temperatures and a relatively high force at elevated temperatures.

Figure 5:
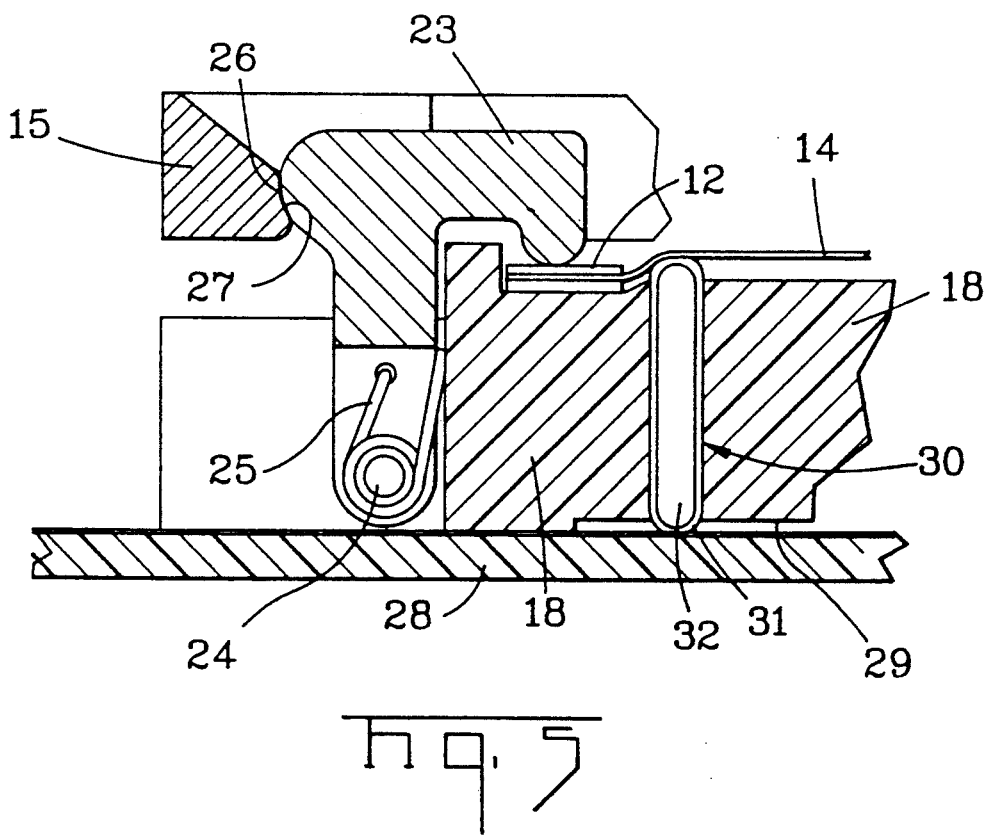
FIG. 5. corresponds substantially to FIG. 4, but shows the latch in its latched position.

A plurality of latches 23 are pivotably mounted on respective pins 24 carried by the housing 18 (as shown more clearly in FIGS. 4 and 5). In the preferred embodiment, there are four latches 23, each of which is disposed on a side of the housing 18 between a respective pair of guide posts 19. Each of the latches 23 is resiliently biased, preferably by means of a torsion spring 25, to an unlatched position (FIG. 4) and the latches 23 and the camming ring 15 have cooperating engaging cam surfaces 26 and 27, respectively.

The housing 18 is suitably supported on a mother board 28 (or other printed circuit board) having at least one circuit element 29 thereon. Preferably, the circuit element 29 is electrically connected to the chip leads 14 by means of a flexible electrical connector 30 supplied by AMP Incorporated (of Harrisburg, Pennsylvania) under its registered trademark "AMPLIFLEX". This flexible electrical connector 30 comprises a plurality of finely-divided electrical elements 31 carried by an elastomeric core 32.

In operation, the chip frame 12 is loaded in the burn-in socket 10, and the latches 23 are flipped to their latched position (FIGS. 3 and 5) either manually or by means of robotic arms (not shown) in an automated burn-in system. The latches 23 exert a sufficient clamping force on the chip frame 12 to assure, first, structural integrity of the chip frame 12 in the burn-in socket 10 and, second, initial electrical contact between the chip leads 14 and the flexible electrical connector 30. This enables the burn-socket 10 with the chip frame (carried therein) to be loaded into a suitable oven (not shown) for burn-in purposes. The latches 23 are fairly small and compact, yet sufficient for the initial retention and electrical engagement purposes; and with the present invention, it is not necessary to employ large cumbersome latches and/or levers to obtain the necessary mechanical advantage and forces required during the extended burn-in period (typically 1,000 hours) primarily to assure good continuous electrical contact principally between the chip leads and the flexible electrical connector.

As the temperature in the oven rises (typically 150° C.) the coil springs 20, being made of a shape memory alloy and hence being thermally reactive, expand to exert an increasingly and relatively-high force (as shown more clearly in FIGS. 3 and 5). As a result, the camming ring 15 is lifted on the guide posts 19, and the cam surfaces 27 on the camming ring 15 engage the respective cam surface 26 on each latch 23, thereby wedging the camming ring 15 against the plurality of latches 23. This wedging action solidly retains the chip frame 12 and assures good electrical contact between the engaging electrical elements (namely, the chip leads 14, flexible electrical connector 30, and circuit element 29 on the mother board 28) continuously during the extended burn-in period.

With the substantially rectangular configuration of the camming ring 15, and with the four latches 23 on the respective sides of the chip frame 12, the clamping means 11 exerts a substantially uniform force on the chip frame 12, thereby accommodating variances and tolerances incurred during manufacturing.

By using the thermally-reactive springs 20, operative during the burn-in cycle itself, the burn-in socket 10 achieves the unique objectives, features and advantages of the present invention.

Obviously, many modifications may be made without departing from the basic spirit of the present invention. For example, the thermally-reactive SMA springs 20 may be configured as torsion springs or leaf springs, if desired, instead of coil springs. Moreover, it will be understood that a plurality of burn-in sockets with their respective chips may be placed in an oven simultaneously consonant with the teachings of the present invention. Accordingly, it will be appreciated by those skilled in the art that within the scope of the appended claims, the invention may be practiced other than has been specifically described herein.

We claim:

1. In a burn-in test socket for an integrated circuit "chip", wherein the chip and socket is heated from abetment temperature to an elevated temperature and maintained at said elevated temperature for a prolonged period of time, and wherein the chip includes a chip frame and further includes a plurality of chip leads, the improvement which comprises:

clamping means engaging the chip frame for applying a normal force of a first magnitude thereto at ambient temperature, and a normal force of a greater magnitude at said elevated temperature, electrical means engaging the chip leads for applying an electrical current thereto during burn-in, and thermally-reactive resilient means for increasing the force applied by said clamping means, the thermally-reactive resilient means providing a relatively low force at ambient temperatures and a relatively high force at high temperatures, such that the clamping means retains the chip frame, and such that good electrical contact is maintained between the electrical means and the chip leads during burn-in.

2. The improvement of claim 1, wherein:
the clamping means includes a camming means and further includes a latching means initially exerting a relatively low force on the chip frame, and
wherein the camming means and the latching means having cooperating cam elements engaging each other, such that the camming means exerts a force through the latching means on to the chip frame.

3. The improvement of claim 2, wherein the camming means comprises a substantially rectangular camming ring having four corners, each of which is provided with an opening; wherein
a housing is provided with four guide posts, one for each of the openings, such that the camming ring is slidably guided on the respective guide posts; and
wherein the latching means comprises four latches, each latch being disposed between a pair of guide posts.

4. The improvement of claim 3, wherein:
the thermally-reactive resilient means comprises four coil springs, each of which is carried on a respective guide post; and
wherein the coil springs are made from a shape memory alloy, such that the coil springs expand at elevated temperatures to raise the camming ring, and such that the camming ring cams the latches against the chip frame, thereby retaining the chip frame.

5. The improvement of claim 3, wherein:
each latch is pivotably mounted on the housing, and
wherein a respective torsion spring biases each latch away from the chip frame.

6. The improvement of claim 1, wherein:
the electrical means for applying an electrical current to the chip leads during burn-in comprises a mother board having at least one circuit element thereon, and
a flexible electrical connector between the circuit element and the respective leads on the chip.

7. The improvement of claim 1, wherein:
the chip and socket are placed in an oven.

8. A burn-in test socket for an integrated circuit chip, wherein:
the chip has a chip frame and further has a plurality of chip leads, and wherein the chip and socket are placed in an oven while the chip is fully powered, comprising
a substantially rectangular housing having four corners,
a guide post on each of the corners,
a coil spring carried on each of the guide posts,
the coil spring being made of a shape memory alloy, such that the coil spring exerts a relatively low force at ambient temperatures and expands to exert a relatively high force at elevated temperatures,
a substantially rectangular camming ring having four corners, each of which is provided with an opening receiving a respective guide post, such that the camming ring is slidably guided on the guide posts, and such that the coil springs are disposed between the housing and the camming ring,
means for precluding the camming ring from being lifted off the guide posts,
a plurality of four latches, each of which is pivotably mounted on the housing, and each of which is disposed between a respective pair of corners on the housing,
cooperating camming means between the latches and the camming ring, respectively,
a mother board having at least one circuit element thereon, and
a flexible electrical connector between the circuit element and the chip leads, such that the chip is fully powered during burn-in;
whereby as the temperature in the oven is increased, the coil springs expand to raise the camming ring on the guide posts, thereby exerting a force on the latches, and through the latches to the chip frame, thereby retaining the chip frame in the socket, and thereby maintaining good electrical contact between the flexible electrical connector and the chip leads during burn-in.

* * * * *

UNITED STATES PATENT AND TRADEMARK OFFICE
CERTIFICATE OF CORRECTION

PATENT NO.  : 5,273,441
DATED       : December 28, 1993
INVENTOR(S) : Keith L. Volz et al.

It is certified that error appears in the above-indentified patent and that said Letters Patent is hereby corrected as shown below:

Claim 1, Column 4, line 3 "abetment" should be --ambient--

Signed and Sealed this

Twenty-third Day of August, 1994

Attest:

BRUCE LEHMAN

Attesting Officer

Commissioner of Patents and Trademarks